United States Patent [19]

Takahashi et al.

[11] 4,356,254
[45] Oct. 26, 1982

[54] IMAGE-FORMING METHOD USING O-QUINONE DIAZIDE AND BASIC CARBONIUM DYE

[75] Inventors: Yohnosuke Takahashi; Hiromichi Tachikawa; Fumiaki Shinozaki; Tomoaki Ikeda, all of Asaka, Japan

[73] Assignee: Fuji Photo Film Co., Ltd., Kanagawa, Japan

[21] Appl. No.: 166,517

[22] Filed: Jul. 7, 1980

[30] Foreign Application Priority Data

Jul. 5, 1979 [JP] Japan ................................. 54-85395

[51] Int. Cl.³ ............................. G03F 7/08; G03C 5/00
[52] U.S. Cl. ........................................ 430/296; 430/5; 430/165; 430/166; 430/190; 430/191; 430/294; 430/299; 430/309; 430/320; 430/323; 430/325; 430/326; 430/330; 430/945
[58] Field of Search ................ 430/191, 325, 326, 945, 430/190, 296, 330

[56] References Cited

U.S. PATENT DOCUMENTS

| | | | |
|---|---|---|---|
| 2,702,243 | 2/1955 | Schmidt | 430/168 |
| 3,567,453 | 3/1971 | Borden | 430/155 |
| 3,669,658 | 1/1972 | Yonezawa et al. | 430/191 |
| 3,902,906 | 9/1975 | Iwama et al. | 430/191 |
| 3,969,118 | 7/1976 | Stahlhofen et al. | 430/191 |
| 4,063,949 | 12/1977 | Uhlig et al. | 430/945 |
| 4,196,003 | 4/1980 | Watanabe | 430/193 |

OTHER PUBLICATIONS

Agnihotri, R. K., *IBM Technical Disclosure Bulletin*, vol. 21, No. 4, p. 1475, 9/78.

*Primary Examiner*—Charles L. Bowers
*Attorney, Agent, or Firm*—Sughrue, Mion, Zinn, Macpeak & Seas

[57] ABSTRACT

An image-forming method is described using a light-sensitive material comprising a support and a light-sensitive layer on the support, said light-sensitive layer containing an o-quinonediazide compound as a first component and a basic carbonium dye as a second component; according to this method images can be obtained both by positive working and negative working techniques. Furthermore, images which are free from yellow light fogging can be obtained by use of a laser beam.

23 Claims, No Drawings

4,356,254

IMAGE-FORMING METHOD USING O-QUINONE DIAZIDE AND BASIC CARBONIUM DYE

BACKGROUND OF THE INVENTION

1. Field of the Invention

This invention relates to an image-forming method. More particularly, it is concerned with an image-forming method using a light-sensitive material containing therein an o-quinonediazide compound as a light-sensitive component which permits the formation of either positive or negative images, and a method of forming images by applying a high intensity energy beam, such as an argon laser or an electron beam, to the light-sensitive material.

2. Description of the Prior Art

As is known in the art, irradiation of an o-quinonediazide compound with active light rays decomposes a diazo group contained therein to form a carboxy group-containing compound which is soluble in an alkali. Therefore, when a light-sensitive material containing such an o-quinonedizide compound is imagewise exposed and developed with an alkaline developer, exposed areas are dissolved in the alkaline developer and removed, whereas unexposed areas remain unremoved on the light-sensitive material, providing positive images.

With a light-sensitive material bearing a light-sensitive layer composed of a composition which contains an o-quinonediazide compound as a light-sensitive component and as a second component a compound containing a secondary amine or tertiary amine or a hydroxy group, as described, for example, in Japanese Patent Application (OPI) Nos. 127615/74 (British Patent No. 1,494,640) and 108002/75 (U.S. Pat. No. 4,196,003), it is possible to obtain positive images by the imagewise exposure followed by the development, as described above. Furthermore, it is also possible to obtain negative images, by subjecting the light-sensitive material to negative working processing wherein it is imagewise exposed to light, heated during or after the imagewise exposure, uniformly exposed to light, and then developed.

As described above, secondary amines or tertiary amines have been used in combination with o-quinonediazide compounds in hitherto known light-sensitive materials. Examples of such tertiary amines include aliphatic amines such as tributylamine and triamylamine, and amines containing a hydroxy group, such as diethanolamine, N-methylethanolamine and triethanolamine.

This light-sensitive material is used, for example, in the application of plate-making. The incorporation of dyes in the light-sensitive layer is very advantageous with respect to printing plate production control since it is easy to visually examine the images formed after the development. Therefore, the use of dyes instead of the secondary amines or tertiary amines as described in the above patent specifications as the second component which permits the reversion in the negative working results in a light-sensitive material of much higher value.

As an imagewise exposure procedure, photomechanical techniques have hitherto been employed in which the printing is carried out by bringing an original into contact with a light-sensitive material (contact printing) or by projecting light through the original. Such an original for use in photomechanical processes has been produced by very complicated methods such as, for example: a method wherein a clean proof obtained from a type composition is photographed on a lith film by use of a plate-making camera, which is then developed and fixed; a so-called facsimile system wherein the clean proof is scanned and transmitted and the signal received is exposed onto a facsimile film, developed and fixed; a method wherein a phototypographic film is exposed by use of a figure-forming apparatus, for example, a manual photocomposer or a computer-controlled photocomposer, and it is then developed and fixed; or a printing paper for photo-composition is exposed, developed and fixed, and then the original so formed is exposed onto film by use of a plate-making camera or facsimile apparatus, developed and fixed. Thus, in the conventional photomechanical process, it has been required to separately produce a transparent original by a method as described above prior to the step of plate-making.

On the other hand, with recent developments in the field of facsimile and computer systems, it has increasingly been required to process a large quantity of output signals at high speed. For this purpose, there has been proposed, for example, a method wherein the output signal is printed on a printing plae, for example, by a laser beam which has been modulated by the output signal.

Such a method of recording an image by a laser beam bearing the recorded information, which requires no original such as must be used for the conventional photomechanical process, is disclosed, for example, in Japanese Patent Application (OPI) No. 151024/79. According to this method, laser beam-sensitivity is provided by using a photopolymerization initiator in combination with an addition polymerizable compound containing at least one ethylenically unsaturated double bond and a merocyanine dye capable of absorbing an argon laser beam.

This method, however, suffers from the major disadvantage that the sensitizing agent (that is, the photopolymerization initiator) itself is sensitive to visible rays such as the argon laser beam, forming fog under yellow light; therefore it should be handled under red light, which is very disadvantageous from the point of view of workability.

Furthermore, such a method utilizing the photopolymerization reaction is greatly inhibited in photopolymerization rate by oxygen in the air. In order to obtain a stable image quality, therefore, it is necessary to apply the following processing conditions: (1) providing an air-shielding layer on the light-sensitive layer; (2) before being exposed, subjecting the light-sensitive layer to a "conditioning" in nitrogen gas. Processing (2) is very complicated in operation and processing (1) leads to a complicated layer construction.

Thus, it has been strongly desired to develop a laser recording system which is advantageous with respect to both production control and operation control.

o-Quinonediazide compounds are widely used as light-sensitive compounds for use in photoresists which are used in the production of semiconductors. In such cases, the photoresist is used in the formation of a diffusion region, or electrode, in a semiconductor substrate, and in the production of a photomask for use therein.

In the production of high density integrated circuits bearing a pattern having line widths of 1 $\mu$m or less, the conventional photographic etching method using light is subject to limitations; that is, such can be practiced only by a photographic etching method using electron beams, X rays or the like. Therefore, negative working type resist materials which are sensitive to various radiation rays, and particularly electron beams, have been developed. Typical examples of such materials are epoxidized 1,4-polybutadiene and polyglycidyl methacrylate. These conventional negative working type electron beam resists are generally inferior in resolving power to positive working type electron beam resists. In order to improve the resolving power, therefore, great efforts have had to be made in the production step of a major component, the electron-sensitive polymer, e.g., by control of polymerization conditions and purification. Additionally, almost all of these negative working type electron beam resists require an organic solvent as a developer. This leads to the disadvantage that great care must be taken with respect to inflammability and pollution problems.

With regard to the former disadvantage of the conventional negative working type electron beam resist, i.e., a large apparatus and complicated steps are required in the production thereof, if conventional ultraviolet ray-sensitive resists could be used as resists for electron beams, no new equipment investment would be required and overall costs would be greatly reduced. Another advantage afforded by the use of the conventional ultraviolet ray-sensitive photoresist is that since very wide experience has been accumulated in each step of development after exposure, etching, etc., and conventional processing equipment can be used, as it is for the productin of photomasks and the like, it can very easily be introduced in to production.

With regard to the latter disadvantage of the conventional negative working type electron beam resists, i.e., that organic solvents must be used as developers, this problem could be solved by making the polymer or binder polymer bound to the o-quinonediazide compound in the light-sensitive layer composition alkalisoluble, and by using an aqueous alkali solution as the developer. However, there is no negative working type electron beam resist having such characteristics among those resists which are in practical use.

For the reasons described above, photoresists have been desired which can be developed with an alkali aqueous solution and can be applied to both photolithography and electron beam lithography.

The problems of conventional techniques in the fields of the printing plates and photoresists have been described above. Therefore, the characteristics of the systems desired in both fields may be summarized as follows:

(1) For the light-sensitive material mainly composed of an o-quinonediazide compound, which can be applied to both positive working and negative working modes, it is desirable that the image after development can be made distinct by the second component which is used to permit the negative working.

(2) It has been desired to develop a laser image-forming method which eliminates the drawbacks, e.g., yellow light fogging, of the conventional techniques.

(3) It has been desired to develop a photoresist which can be developed with an aqueous alkali solution and which can be applied to both photolithography and electron beam lithography.

SUMMARY OF THE INVENTION

An object of this invention is to provide an image-forming method which is advantageous for visualizing the image after development and which can be processed using either positive working and negative working techniques.

Another object of this invention is to provide a laser-sensitive image-forming method which is substantially insensitive under ordinary yellow room illumination light.

Still another object of this invention is to provide a negative working type high intensity energy beam (laser beam or electron beam)-sensitive image-forming method wherein a light-sensitive material made up of a composition comprising a alkali aqueous solution developable ultraviolet ray-sensitive light-sensitive resin (photo-resist) and a basic carbonium dye is employed.

This invention, therefore, provides an image-forming method which comprises imagewise exposing a light-sensitive material comprising a support and a light-sensitive composition layer provided on the support, the light-sensitive composition layer containing an o-quinonediazide compound as a first component and a basic carbonium dye as a second component, to light to which the o-quinonediazide compound is sensitive, subjecting the light-sensitive material to negative working or positive working processing steps, and then developing with an alkaline developer.

It has been found that the characteristic of an o-quinonediazide-containing light-sensitive material capable of both positive and negative working can be achieved by using a basic carbonium dye as the second component instead of the amines as described in Japanese Patent Application (OPI) No. 108002/75 (U.S. Patent No. 4,196,003). Surprisingly, it has further been found that not only the above characteristic but also the characteristics of eliminating yellow light fogging and being developable by an aqueous alkali solution can be achieved by incorporating the carbonium dye as the second component.

Additionally, this invention provides an image-forming method which comprises overall exposing a light-sensitive material comprising a support and a light-sensitive composition layer according to the invention provided on the support, the light-sensitive composition layer containing an o-quinonediazide compound as a first component and a basic carbonium dye as a second component, to light to which the o-quinonediazide compound is sensitive, imagewise irradiating the material during or after the overall exposure with a high intensity energy beam, and then dissolving the light-sensitive composition layer in areas not irradiated with the high intensity energy beam by use of an alkaline developer.

DETAILED DESCRIPTION OF THE INVENTION

With regard to the function of the second component in the light-sensitive composition and the irradiation of the high intensity energy beam (laser beam or electron beam), it is believed that the high intensity energy changes into heat energy in the light-sensitive layer and accelerates the reaction of the solubilizing of the photo-decomposition product of the o-quinonediazide compound in the alkaline developer by the second component.

o-Quinonediazide compounds for use in the method of this invention have very widely been used as the major component for positive working type light-sensitive photoresists (for example, a liquid positive working type photoresist produced by Shipley Corp., U.S.A.

under the trade name of AZ-1350). The reasons for this are: (1) very high definition can be obtained by a conventional exposure system using near ultraviolet rays (e.g., a line width of 0.5 μm can be resolved); (2) the chemical resistance and the resist-removing properties are excellent; and (3) the development can be carried out by using an aqueous alkali solution.

One of the features of this invention resides in the fact that by using a light-sensitive resin (photo-resist) containing the o-quinonediazide compound which provides high resolving power on application of near ultraviolet rays can be formed using negative working while maintaining the excellent resolving power, or by using electron beams images can also be formed using negative working.

Supports for use in the light-sensitive material of this invention include substances in a planar form or in other forms which are not subject to marked dimensional changes. Examples of substances which can be used in the planar form include glass, a silicon monocrystal plate, silicon oxide, ceramics, paper, metals (e.g., aluminum, zinc, magnesium, copper, iron, chromium, nickel, silver, gold, platinum, palladium, an alloy containing aluminum as a major component, an alloy containing zinc as a major component, an alloy containing magnesium as a major component, a copper-zinc alloy, an iron-nickel-chromium alloy, and an alloy containing copper as a major component), and polymers (e.g., regenerated cellulose, cellulose nitrate, cellulose diacetate, cellulose triacetate, cellulose acetate butyrate, cellulose acetate propionate, polystyrene, polyethylene terephthalate, polyethylene isophthalate, a polycarbonate of bisphenol A, polyethylene, polypropylene, nylons (6-nylon, 6,6-nylon, 6,10-nylon, etc.), polyvinyl chloride, a vinyl chloride-vinyl acetate copolymer, a vinyl chloride-acrylonitrile copolymer, a vinyl chloride-vinylidene chloride copolymer, polyacrylonitrile, polymethyl acrylate, and polymethyl methacrylate). Additionally, planar materials produced by firmly laminating two or more thin plates of the above substances, e.g., a cermet, an iron-aluminum laminated plate, an iron-copper-aluminum laminated plate, an iron-chromium-copper laminated plate, a paper with polyethylene coated on the surface thereof, a paper with cellucose triacetate coated on the surface thereof, an aluminum plate with an aluminum oxide layer provided by anodic oxidation on the surface thereof, a chromium plate with a chromium oxide layer provided by a known method on the surface thereof, a glass plate with a tin oxide layer provided on the surface thereof and a silicon oxide plate with an indium oxide layer provided on the surface thereof can also be used as a support.

From these supports, a transparent or opaque support can be selected depending upon the particular use of the light-sensitive material. In addition to colorless transparent supports, those colored transparent supports prepared by adding a dye or pigment as described in J. SMPLE, Vol. 67, page 296 (1958) can be used. As opaque supports, those produced by adding a dye or pigment, e.g., titanium oxide, to transparent materials, plastic films which are subjected to surface processing in the manner as described in Japanese Patent Publication No. 19068/72 (British Pat. No. 1,237,475), and paper and plastic films which are made completely light-shielding by adding carbon black or the like, etc., can be used, in addition to those which are originally opaque, such a paper and metal. Moreover, supports provided with fine unevenness on the surface thereof by sand graining, electrolytic etching, anodic oxidatin, chemical etching, etc., and supports with surfaces subjected to preliminary processings such as corona discharge, ultraviolet ray irradiation, flame processing, etc., can be used. In addition, plastic supports which are increased in strength by incorporating a reinforcing agent such as glass fibers, carbon fibers, boron fibers, various metal fibers, metal whiskers or the like can also be used.

On the surface of the support there may be provided, if desired, a coating layer, an antihalation layer, an ultraviolet ray absorbing layer, and a visible ray absorbing layer for the purpose of increasing the adhesion between the support and the light-sensitive resin composition layer.

Hereinafter the light-sensitive layer will be explained in more detail. This light-sensitive layer contains an o-quinonediazide compound as a first component and a basic carbonium dye as a second component. It may also contain a polymeric binder.

An o-quinonediazide compound for use in this invention is a compound containing therein at least one o-quinonediazido group, the solubility in an alkaline solution of which is increased by irradiation with active light. o-Quinonediazide compounds having various structures are known, and are described in detail, for example, in J. Kosar, *Light-Sensitive Systems*, John Wiley & Sons, Inc., 1965. In particular, sulfonic acid esters of various hydroxyl compounds and o-benzoquinonediazide or o-naphthoquinonediazide are suitable. Representative examples are 2,2'-dihydroxydiphenyl-bis-[naphthoquinon-1,2-diazido-5-sulfonic acid ester], 2,2',4,4'-tetrahydroxydiphenyltetra[naphthoquinone-1,2-diazido-5-sulfonic acid ester], 2,3,4-trioxybenzophenone-bis-[naphthoquinon-1,2-diazido-5-sulfonic acid ester], etc. In particular, esters of polyhydroxybenzene obtained by polycondensation of acetone and pyrogallol and naphthoquinon-1,2-diazido-5-sulfonic acid are advantageously used.

As the basic carbonium dye of the second component, various compounds can be used. They are described, for example, in Yutaka Hosoda, *Riron Seizo Senryo Kagaku*, Gihodo, Japan (October 1963). In general, carbonium dyes are broadly grouped, according to the molecular structure thereof, into diphenylmethane dyes, triphenylmethane dyes, xanthene dyes and acridine dyes, all of which can be used in this invention.

Examples of useful diphenylmethane dyes include Auramine (CI 41000) and Auramine G (CI 41005).

Examples of useful triphenylmethane dyes include Malachite Green (CI 42000), Brilliant Green (CI 42040), Astrazone Blue G (CI 42025), Fuchsine (CI 42510), Fuchsine NB (CI 42520), Para Fuchsnine (CI 52500), Methyl Violet (CI 42535), Crystal Violet (CI 42555), Methyl Green (CI 42585), Astracyanine B (CI 42705), Victoria Blue B (CI 44045), Aizen Victoria Pure Blue BOH (CI 42595), Spirit Blue (CI 42775), Paramagenta Base (CI 42500), Aizen Basic Cyanine 6GH (CI 42025), Astrazone Blue B (CI 42140) and Aizen Diamond Green GH (CI 42040).

Examples of useful xanthene dyes include Pyronine G (CI 45005), Rhodamine B (CI 45170), Rhodamine 3B (CI 45175), Rhodamine 6G (CI 45160) and Rhodamine 6GCP (CI 45160).

Examples of useful acridine dyes include Acridine Orange NO (CI 46005), Phosphine (CI 46045), Rheonine AL (CI 46075), Acriflavine (CI 46000), Acridine Yellow G (CI 46025) and Benzoflavine (CI 46065).

With regard to the mixing ratio of the o-quinonediazide compound and the basic caronium dye, the amount of the basic carbonium dye is preferably from about 0.005 to 1 part by weight per part by weight of the o-quinonediazide compound, with the range of from about 0.01 to 1 part by weight being particularly suitable.

A laser beam is, as is well known, a bright line of coherent light having a very specific wavelength, and the wavelength varies depending upon the type of laser. For making the light-sensitive material sensitive to various laser beams, it is particularly preferred that two or more dyes having different absorption spectra in the visible region be combined.

To the light-sensitive resin composition for use in this invention there can be added, in addition to the above-described components, various additives. For increasing the image intensity, or as a binder, polymers uniformly compatible with the above components, such as a styrene-maleic anhydride copolymer, a styrene-acrylic acid copolymer, a methacrylic acid-methyl methacrylate copolymer, etc., can be added. The techniques by which such additives can be combined with the other components are conventional techniques which are well known to those skilled in the art.

To prepare a material for use in the method of the invention, a light-sensitive resin composition having a composition as described above is applied onto the support. The light-sensitive resin composition can be dissolved in a suitable solvent and applied as a solution onto the support. The solvent can appropriately be selected from known solvents which do not deteriorate the photographic characteristics of the light-sensitive resin composition. The application of the light-sensitive resin composition or the solution thereof can be carried out by known methods. The typical application method is a coating method, and the application can easily be carried out by one skilled in the art.

The light-sensitive material produced as described above is imagewise exposed and, if desired, overall exposed by a conventional method with a light to which the o-quinonediazide compound is sensitive (usually near ultraviolet light and visible light having a wavelength of from about 290 nm to 500 nm). As the source for the light, a mercury lamp, a xenon lamp, a carbon arc lamp, a tungsten lamp, a fluorescent lamp, sunlight and the like can be used.

According to one embodiment of this invention, a light-sensitive material which has been imagewise exposed is heated and then overall exposed. The heat treatment accelerates the insolubilization of exposed areas. The heating can be carried out simultaneously with the imagewise exposure or after the exposure. The heating is applied so that the temperature is at least 30° C., and preferably is from 70° C. to 300° C. In the range of from 30° C. to 70° C., relatively long periods of time are required for the processing, and in the range exceeding 300° C. the light-sensitivity of the unexposed areas is reduced. Therefore, it is preferred to apply the heat treatment within the above defined temperature range.

The time required for the heat treatment varies depending upon the heating temperature; for example, it may be from 5 minutes to 30 minutes at a temperature of 100° C., and from 5 seconds to 30 seconds at the temperature of 250° C. Furthermore, it varies depending upon the composition and thickness of the light-sensitive layer. For each light-sensitive material, therefore, the suitable heating temperature and heating time can be determined. Various heating methods can be used for the heating including a method wherein the light-sensitive material is placed in a heated gas, a method wherein the light-sensitive material is placed in a heated liquid and a method wherein the light-sensitive material is brought into contact with a heated solid.

The entire surface of the light-sensitive material thus heated is then irradiated with the actinic rays. This irradiation processing is carried out so that the light-sensitive layer in the unexposed areas can be removed by the subsequent development processing. It is required, therefore, that at least the unexposed areas be irradiated with the actinic rays. However, since the exposed areas of the light-sensitive layer now have no light-sensitivity and undergo no further change by the irradiation processing with the actinic rays, the entire surface of the light-sensitive layer can be uniformly irradiated with the active rays. The exposure amount applied to the light-sensitive layer during the entire exposure is sufficient if it is nearly equal to that applied on the exposed areas for the imagewise exposure.

The light-sensitive material entirely exposed with the light to which the o-quinonediazide compound is sensitive is then exposed by scanning thereon the high intensity energy beam (laser beam or electron beams) modulated by the image signal.

Laser beams which can be used in the method of this invention include an infrared ray laser beam, an ultraviolet ray laser beam and a visible light laser beam. Of these laser beams, the visible light laser beam is preferred. As the visible light laser, there can be mentioned a helium neon laser, an ion (e.g., argon, krypton, etc.) laser, a helium cadmium laser, etc. Lasers emitting rays outside the visible region, for example, an $Nd^{3+}$: YAG (yttrium-aluminum garnet) laser can be used. For example, there are available on the market those argon lasers having total outputs of visible line of about 3 W (watts), 4 W, 6 W, 9 W, 16 W and 24 W. In the method of this invention, those lasers having a total output of 3 to 4 W are sufficient.

Since the energy losses in the optical system amounts to about 50%, only a half of the original total energy reaches the light-sensitive layer of the light-sensitive material. However, if this beam is reduced by an optical lens system to a beam diameter of from 42 $\mu$m to 70 $\mu$m which is required, for example, for a newspaper facsimile receiver, it is possible to form an image at a scanning speed of from about 12 m/sec to 22 m/sec, which is now usually used.

For the electron beam irradiation, the electron beam current is controlled by the output signal from the electric computer, etc., and scanned monodimensionally on the light-sensitive material. However, the unidimensional scanning method is not always required for the electron beam irradiation, and there may be employed a method wherein the electron beams are applied bidimensionally at one time with a mask placed between the electron beam emitting electrode and the light-sensitive material.

The imagewise exposure and related processings in the image-forming method of this invention having now been explained, the next portion of this description relates to the development processing aspects.

The developer for use in the development processing according to this invention can be selected from many known developers which are used to develop the conventional light-sensitive layer containing the o- quinonediazide compound; that is, it can easily be developed by soaking in or washing with an alkaline solution.

Preferred alkaline solutions include aqueous solutions containing inorganic compounds such as sodium hydroxide, potassium hydroxide, sodium silicate, potassium silicate, sodium phosphate, potassium phosphate, sodium carbonate and potassium carbonate, and aqueous solutions containing organic bases such as ethanolamine, diethanolamine, triethanolamine and tetramethylammonium hydroxide. If desired, other conventional components such as organic solvents, surface active agents, etc., can be incorporated by known techniques.

An image obtained by processing as described above can find very many applications. For example, when a sand-grained aluminum support is used as the support and the light-sensitive material so obtained is mounted on a printing machine, good quality printed matter can be obtained. When the dye-incorporated light-sensitive layer of this invention is provided on a transparent plastic film, such as a polyester film, the light-sensitive material so obtained can be used for the correction of a press plate.

The developed light-sensitive material can be subjected to post-treatments, depending upon the use thereof. For example, where a glass substrate with a chromium vapor-deposited film provided thereon is used as a support, if the chromium vapor-deposited film, after the development, is etched, using the light-sensitive layer as an etching resist, by use of a known etching solution containing cerium (IV) ions, and then the resist is removed, the material so obtained can be used as a hard mask. Furthermore, where a silicon substrate is used as a support, the light-sensitive material so obtained can be used as an etching resist for a silicon oxide coating film and in a lift-off step. In addition, where a copper foil substrate for a printed circuit wiring substrate is used, the developed light-sensitive material can be used as an etching resist or a plating resist.

The present invention wherein the imagewise recording is carried out by use of a laser, can be applied for producing a photomask, for recording the output signal of the computer by a laser signal and to a facsimile terminal recording material.

In addition to the above-described applications, the image obtained by this invention can be used in the production of a video disc. However, this invention is not limited thereto.

The following examples are provided to illustrate this invention in greater detail.

EXAMPLE 1

A mixture of 1 part by weight of a 1,2-naphthoquinonediazido-5-sulfonic acid ester of polyhydroxybenzene, which had been obtained by the polycondensation of acetone and pyrogallol as described in Example 1 of Japanese Patent Publication No. 28403/68 (U.S. Pat. No. 3,635,709), 2 parts by weight of a phenol resin (PR-50904 produced by Sumitomo Dures Co.; degree of polymerization: 3 to 10) and 0.25 part by weight of Aizen Victoria Pure Blue BOH (CI 42595) was dissolved in a mixed solvent of 20 parts by weight of methyl ethyl ketone and 20 parts by weight of Methyl Cellosolve Acetate and filtered through a filter with a pore size of 0.5 μm to obtain a light-sensitive liquid.

Aluminum and iron were vapor deposited at the same time on a 2.5 square inches (1.6 mm thick) clean soda lime glass substrate such that an atomic ratio of aluminum to iron of 98.5 to 1.5 was obtained to provide a support with a 70 nm thick film vapor-deposited thereon.

The above light-sensitive liquid was coated on the vapor deposited film of the support by use of a rotary coating apparatus so that the dry film thickness was 0.6 μm to produce two sheets of light-sensitive materials.

Each light-sensitive material was brought into close contact with a chromium mask for a resolving power test and imagewise exposed (contact exposure) for 9 seconds at a position 55 cm from a 2 KW super high pressure mercury lamp. These light-sensitive materials were designated light-sensitive materials (a) and (b).

Light-sensitive material (a) was, after the imagewise exposure, heated at 100° C. for 10 minutes in an air thermostat cooled and thereafter it was subjected to the entire exposure (post-exposure) under the same conditions as used in the above imagewise exposure. On the other hand, light-sensitive material (b) was not subjected to the heating and the entire exposure.

These light-sensitive materials were soaked at the same time in a developer (31° C.) which had been prepared by dissolving 4 parts by weight of sodium hydroxide, 10 parts by weight of sodium phosphate (12 hydrate) and 10 parts by weight of potassium bromide in 1000 parts by weight of water, taken out therefrom after 25 seconds, washed with water and dried.

With light-sensitive material (a), the light-sensitive layer in the unexposed areas and the vapor deposited layer were dissolved, whereas the light-sensitive layer and the vapor deposited layer in the exposed areas remained undissolved. Thus, a negative working photomask image was obtained. On the other hand, with light-sensitive material (b), the light-sensitive layer and the vapor deposited layer in the exposed areas were dissolved, and a positive working photomask image was obtained.

Both of the photomask images formed on light-sensitive materials (a) and (b) showed almost no pin holes in the image areas and were completely free from fog in the non-image areas and showed good resolution of a line width of 1.5 μm. The transmission optical density of the vapor deposited film (mask layer) in the image areas was 3.4.

EXAMPLE 2

In the same manner as in Example 1, except that Compounds (A) through (H) as illustrated in Table 1 were used in place of the Aizen Victoria Pure Blue BOH in the light-sensitive liquid, a light-sensitive material with a light-sensitive layer of a dry thickness of 1.0 μm was produced. On following the same processing steps as were used in the case of light-sensitive material (a), the light-sensitive layer and the vapor-deposited layer in the unexposed areas were dissolved, while the layers in the exposed areas remained undissolved on the glass support, and thus a negative working image corresponding to the imagewise exposure was obtained.

TABLE 1

| | |
|---|---|
| Compound A | Auramine (CI 41000) |
| Compound B | Crystal Violet (CI 42555) |
| Compound C | Methyl Green (CI 42585) |
| Compound D | Methyl Violet (CI 42535) |
| Compound E | Aizen Basic Cyanine 6GH (CI 42025) |
| Compound F | Rhodamine 6GCP (CI 45160) |
| Compound G | Rhodamine B (CI 45170) |

TABLE 1-continued

| | |
|---|---|
| Compound H | Acridine Orange NO (CI 46005) |
| Methyl Cellosolve Acetate | 120 " |

EXAMPLE 3

In the same manner as in Example 1 except that Fuchsine (CI 42510) was used in place of Aizen Victoria Pure Blue BOH, two sheets of light-sensitive materials bearing a light-sensitive layer having a dry thickness of 1.0 μm were produced. These light-sensitive materials were designated light-sensitive material (c) and light-sensitive material (d).

On applying to light-sensitive material (c) the same processings as used for light-sensitive material the light-sensitive layer and the vapor deposited layer in the unexposed areas were dissolved and those in the exposed areas remained undissolved on the glass support. Thus, a negative working image corresponding to the imagewise exposure was obtained.

Light-sensitive material (d) was entirely exposed for 20 seconds with a 2 KW super high pressure mercury lamp at a position 55 cm therefrom, and a argon ion laser beam emitting visible rays with wavelengths of 488 nm and 514.5 nm was scanned on the light-sensitive material at a speed of 19 m/sec so that the beam diameter on the surface of the light-sensitive layer was 25 μm; the power was 500 mW.

This light-sensitive material (d) was then developed with the same developer as used in Example 1 (31° C.), washed with water and dried, whereupon the light-sensitive layer and the vapor deposited layer in the areas not irradiated with the laser beam were dissolved, while the layers in the areas irradiated with the laser beam remained on the glass support. Thus, an image corresponding to the laser scanning was obtained.

EXAMPLE 4

A planographic aluminum plate (aluminum alloy consisting of 99% of aluminum, 0.6% of magnesium and 0.4% of silica), which had been sand-grained by a mechanical method, was soaked for 1 minute in a 2% by weight aqueous solution of sodium hydroxide maintained at 40° C. to etch the surface thereof. After water-washing, it was soaked for about 1 minute in a sulfuric acid-chromic acid mixed solution to expose the surface of the pure aluminum. Thereafter, it was soaked in a 20% surfuric acid solution maintained at 30° C., and subjected to anodic oxidation for 2 minutes under the conditions: direct current voltage of 15 V, current density of 3 A/dm². It was then soaked for 90 seconds in a 2.0% by weight aqueous solution of sodium molybdenate maintained at 65° C. and dried.

A light-sensitive liquid having the following formulation was prepared and coated by use of a rotary coating apparatus on the aluminum plate as produced above so that the thickness of the light-sensitive layer was 2.5 μm to obtain two sheets of light-sensitive materials. These light-sensitive materials were designated light-sensitive material (e) and light-sensitive material (f). Light-Sensitive Liquid

| | | |
|---|---|---|
| 1,2-Naphthoquinonediazide Compound | 10 | parts by weight |
| (the same as used in Example 1) | | |
| Phenol Resin | 20 | " |
| (the same as used in Example 1) | | |
| Fuchsine (CI 42510) | 1 | " |
| Methyl Ethyl Ketone | 120 | " |
| Methyl Cellosolve Acetate | 120 | " |

In the same manner as in Example 1, light-sensitive materials (e) and (f) were imagewise exposed for 1 minute through a photomask produced from a lith film.

Light-sensitive material (e) was heated at 100° C. for 10 minutes and then overall exposed by the same method as employed for the light-sensitive material (a) in Example 1. On soaking the thus processed light-sensitive material in a solution (27° C.) which had been prepared by diluting with water a positive working type pre-sensitized plate developer (DP-b 1 produced by Fuji Photo Film Co., Ltd.) in such a manner that the volume ratio of the developer to water was 1:6, the light-sensitive layer in the unexposed areas were dissolved and removed, whereas that in the exposed areas remained undissolved. Thus, a negative working image corresponding to the original was obtained.

With regard to light-sensitive material (f), it was subjected to the same development processing as used for light-sensitive material (e), and a positive working image corresponding to the original was thus obtained.

In both light-sensitive materials (e) and (f), the color density of the image was sufficiently high and could be easily observed by the naked eye.

These light-sensitive materials were further processed with a desensitizing solution having the following formulation:

| | | |
|---|---|---|
| Gum Arabic | 100 | parts by weight |
| Phosphoric Acid | 40 | " |
| (85% by weight aqueous solution) | | |
| Ammonium Dichromate | 80 | " |
| o-Phenylenediamine | 60 | " |
| Water | 1000 | " |

The thus-processed light-sensitive materials (e) and (f) were mounted on an offset printing machine as printing plates. During printing, the ink adhered well to the light-sensitive layers in both light-sensitive materials (e) and (f), and negative and positive images corresponding to the original were obtained on the printed paper.

EXAMPLE 5

In the same manner as in Example 4, light-sensitive material (g) was produced. This light-sensitive material was overall exposed for 1 minute by the same method as used in Example 1, and an argon ion laser beam emitting visible rays with wavelengths of 488 nm and 514.5 nm was scanned thereon. The laser beam diameter on the surface of the light-sensitive material was 100 μm and the scanning speed was 4.5 m/sec. In this case, the scanning was carried out so that the beam energy on the surface of the light-sensitive resin composition layer was 800 mW.

Thereafter, on developing light-sensitive material (g) in the same manner as in Example 4, the light-sensitive layer in the areas irradiated with the laser beam remained on the aluminum support whereas the light-sensitive layer in the areas not irradiated with the laser beam was dissolved and removed. There was thus obtained an image corresponding to the laser irradiation image.

Subsequently, the light-sensitive material was processed with the same desensitization solution as was used in Example 4, and mounted on an offset printing machine. During printing the ink adhered well to the light-sensitive layer and printed matter corresponding to the laser beam scanning was obtained.

EXAMPLE 6

In the same manner as in Example 1, light-sensitive material (h) bearing a light-sensitive layer of a dry thickness of 1.0 μm was produced. This light-sensitive material was overall exposed for 20 seconds in the same manner as in Example 5. Thereafter, a helium neon laser having an output of 10 mW was controlled to a beam diameter of 20 μm and scanned on the light-sensitive layer at a speed of 1 cm/sec.

On developing the light-sensitive material so scanned in the same manner as in Example 1, the light-sensitive layer and the vapor deposited layer in the areas irradiated with the laser beam remained on the glass support, whereas the light-sensitive layer and the vapor deposited in the areas not irradiated with the laser beam were dissolved and removed. Thus, an image corresponding to the laser beam scanning pattern was obtained.

EXAMPLE 7

A support was produced by vapor depositing a 100 nm thick chromium layer on a glass plate as used in Example 1 by the vacuum vapor depositing method. On the vapor deposited film the same light-sensitive liquid as in Example 1 was coated in the same manner as in Example 1 to prepare light-sensitive material (i) bearing a light-sensitive layer having a thickness of 0.6 μm.

This light-sensitive material (i) was placed under a 2 KW super high pressure mercury lamp at a position 55 cm therefrom and overall exposed for 20 seconds. Then, a 180 mesh copper mask was superposed on the light-sensitive plate. From above the superposed member, electron beams emitted at an acceleration voltage of 20 KV were scanned to irradiate an electrical quantity of $9 \times 10^{-5}$ Coulomb/cm$^2$.

On soaking this light-sensitive material (i) for 15 seconds in the same developer as used in Example 1, the light-sensitive layer in the areas not irradiated with the electron beams was dissolved whereas the areas irradiated with the electron beams remained.

Then, this light-sensitive material (i) was heated at 150° C. for 10 minutes in an air thermostat, cooled and thereafter soaked at 25° C. for 1 minute in an etching liquid which had been prepared by mixing 50 ml of nitric acid (61% by weight concentration), 125 g of ammonium cerium (IV) nitrate and 800 ml of water, then washed with water, whereupon the relief of the light-sensitive layer formed by the development processing acted as an etching resist and the chromium vapor deposited layer in the areas corresponding to those not irradiated with the electron beams was dissolved in the etching liquid.

EXAMPLE 8

In the same manner as in Example 7, except that Compounds (A) to (H) as used in Example 2 (Table 1) were each coated on the same chromium vapor deposited support as in Example 7 in place of the Victoria Pure Blue BOH contained in the light-sensitive liquid as used in Example 1, a light-sensitive liquid was coated to obtain 8 sheets of light-sensitive materials having a dry film thickness of 0.6 μm. These light-sensitive materials were each, in the same manner as used for the light-sensitive material (i) in Example 7, overall exposed, scanned with electron beams, developed and etched, whereupon a chromium mask image was obtained corresponding to the electron beam scanning.

While the invention has been described in detail and with reference to specific embodiment thereof, it will be apparent to one skilled in the art that various changes and modifications can be made therein without departing from the spirit and scope thereof.

What is claimed is:

1. An image-forming method which comprises imagewise exposing a light-sensitive material comprising a support and a light-sensitive composition layer provided on the support, said light-sensitive composition layer consisting of an o-quinonediazide compound as a first component and a basic carbonium dye as a second component, to light to which the o-quinonediazide compound is sensitive, whereby said compound becomes alkali soluble, overall heating the light-sensitive material simultaneously with imagewise exposure or after imagewise exposure to insolubilize the exposed areas, overall exposing the thus-processed material to light to solubilize unexposed areas and then developing with an alkaline developer to provide a negative image by removing alkaline soluble areas of said layer.

2. An image-forming method as in claim 1, wherein the basic carbonium dye is a diphenylmethane dye, a triphenylmethane dye, a xanthene dye, an acridine dye, or combinations thereof.

3. An image-forming method as in claim 2, wherein the amount of basic carbonium dye is from about 0.005 to 1 part by weight per part by weight of the o-quinonediazide compound.

4. An image-forming method as in claim 3, wherein the amount of basic carbonium dye is from about 0.01 to 1 part by weight per part by weight of the o-quinonediazide compound.

5. The image-forming method as in claim 1, wherein said o-quinonediazide compound is an o-benzoquinonediazide or an o-naphthoquinonediazide.

6. The image-forming method as in claim 1, wherein said o-quinonediazide compound is a sulfonic acid ester of a hydroxyl compound and an o-quinonediazide.

7. The image-forming method as in claim 1, wherein said basic carbonium dye is a diphenylmethane dye.

8. The image-forming method as in claim 1, wherein said basic carbonium dye is a triphenylmethane dye.

9. The image-forming method as in claim 1, wherein said basic carbonium dye is a xanthene dye.

10. The image-forming method as in claim 1, wherein said basic carbonium dye is an acridine dye.

11. An image-forming method which comprises imagewise exposing a light-sensitive material comprising a support and a light-sensitive composition layer provided on the support, said light-sensitive composition layer consisting of a binder, an o-quinonediazide compound as a first component and a basic carbonium dye as a second component, to light to which the o-quinonediazide compound is sensitive, whereby said compound becomes alkali soluble, overall heating the light-sensitive material simultaneously with imagewise exposure or after imagewise exposure to insolubilize the exposed areas, overall exposing the thus-processed material to light to solubilize unexposed areas and then developing with an alkaline developer to provide a negative image by removing alkaline soluble areas of said layer.

12. An image-forming method which comprises overall exposing a light-sensitive material comprising a support and a light-sensitive composition layer provided on the support, said light-sensitive composition layer containing an o-quinonediazide compound as a first component and a basic carbonium dye as a second component, to light to which the o-quinonediazide compound is sensitive, imagewise irradiating the light-sensitive materials with a high intensity energy beam after the overall exposure, and then dissolving the light-sensitive composition layer at areas not irradiated by the high intensity energy beam by use of an alkaline developer.

13. An image-forming method as in claim 12, wherein the high intensity energy beam is a laser beam.

14. An image-forming method as in claim 12, wherein the high intensity energy beam is an electron beam.

15. An image-forming method as in claim 12, 13, or 14, wherein the basic carbonium dye is a diphenylmethane dye, a triphenylmethane dye, a xanthene dye, an acridine dye, or combinations thereof.

16. An image-forming method as in claim 15, wherein the amount of basic carbonium dye is from about 0.005 to 1 part by weight per part by weight of the o-quinonediazide compound.

17. An image-forming method as in claim 16, wherein the amount of basic carbonium dye is from about 0.01 to 1 part by weight per part by weight of the o-quinonediazide compound.

18. The image forming method as in claim 12, wherein said o-quinonediazide compound is an o-benzoquinonediazide or an o-naphthoquinone diazide.

19. The image forming method as in claim 12, wherein said o-quinonediazide compound is a sulfonic acid ester of a hydroxyl compound and an o-quinonediazide.

20. The image forming method as in claim 12, wherein said basic carbonium dye is a diphenylmethane dye.

21. The image forming method as in claim 12, wherein said basic carbonium dye is a triphenylmethane dye.

22. The image forming method as in claim 12, wherein said basic carbonium dye is a xanthene dye.

23. The image forming method as in claim 12, wherein said basic carbonium dye is an acridine dye.

* * * * *